(12) United States Patent
Pass

(10) Patent No.: US 6,981,194 B1
(45) Date of Patent: Dec. 27, 2005

(54) METHOD AND APPARATUS FOR ENCODING ERROR CORRECTION DATA

(75) Inventor: Alexander M. Pass, North Andover, MA (US)

(73) Assignee: Network Appliance, Inc., Sunnyvale, CA (US)

(*) Notice: Subject to any disclaimer, the term of this patent is extended or adjusted under 35 U.S.C. 154(b) by 492 days.

(21) Appl. No.: 10/237,939

(22) Filed: Sep. 9, 2002

Related U.S. Application Data

(60) Provisional application No. 60/335,996, filed on Nov. 15, 2001.

(51) Int. Cl.[7] .............................................. H03M 13/00
(52) U.S. Cl. ..................... 714/752; 714/746
(58) Field of Search ............................... 714/752, 746, 714/762, 776

(56) References Cited

U.S. PATENT DOCUMENTS

| | | | | |
|---|---|---|---|---|
| 5,841,793 A | * | 11/1998 | Fukuda ........................ | 714/752 |
| 6,126,310 A | * | 10/2000 | Osthoff et al. ............... | 714/751 |
| 6,477,669 B1 | * | 11/2002 | Agarwal et al. ............. | 714/708 |
| 6,594,798 B1 | | 7/2003 | Chou et al. ................... | 714/820 |
| 6,735,200 B1 | | 5/2004 | Novaes ......................... | 370/390 |
| 6,748,447 B1 | | 6/2004 | Basani et al. ................ | 709/244 |
| 6,807,578 B2 | | 10/2004 | Satran et al. ................ | 709/235 |
| 2002/0150094 A1 | | 10/2002 | Cheng et al. ................ | 370/389 |

* cited by examiner

*Primary Examiner*—Phung My Chung
(74) *Attorney, Agent, or Firm*—Weingarten, Schurgin, Gagnebin & Lebovici LLP

(57) ABSTRACT

A system and a method for forward error correction (FEC) which are efficient in terms of computational requirements and the amount of redundant information that must be transmitted. Given a set of input data transfer units (DTUs), to be sent from a transmitting device to a receiving device, the disclosed system uses prime numbers to generate subsets of the input DTUs. Subsets generated in this way are used to generate corresponding error correction DTUs by applying an XOR operation to all DTUs of the subset. The error correction DTUs are then appended to the input DTUs and transmitted to the receiver(s) as part of a burst. The error correction DTUs accordingly provide error correction information for data DTUs transmitted within a burst, and are used by receiving devices to restore data DTUs within the burst that were damaged or lost.

22 Claims, 8 Drawing Sheets

METHOD AND APPARATUS FOR ENCODING ERROR CORRECTION DATA

CROSS REFERENCE TO RELATED APPLICATIONS

This application claims priority under 35 U.S.C. §119(e) to provisional patent application Ser. No. 60/335,996 filed Nov. 15, 2001.

STATEMENT REGARDING FEDERALLY SPONSORED RESEARCH OR DEVELOPMENT

N/A

BACKGROUND OF THE INVENTION

The present invention relates generally to communication protocols, and more specifically to a system for forward error correction within a communication network.

As it is generally known, it is often advantageous to encode transmitted data in a way that permits a receiving network device to recover data that was lost in transit from the transmitting network device. For example, in an environment where a single transmitting device is sending data over various specific routes to a large number of receiving devices, different data may be lost across the different routes, potentially resulting in the need to retransmit large portions of the total originally transmitted data. Such a scenario arises in the case of multicast transmissions, where a single transmitter sends data to potentially thousands of receivers using multicast destination addresses.

In order to reduce the amount of retransmitted data, data encoding systems have been developed which enable a receiver to reconstruct lost data based on other, correctly received data. These data encoding systems are sometimes referred to as "Forward Error Correction" (FEC) systems. Forward Error Correction (FEC) is a technique whereby additional information is sent with data to recover from transmission errors in a manner which is often more concise than by straightforward retransmission. Initially, techniques were applied to repair bit errors within data packets. More recently, techniques have been applied at the packet level to recover from packet losses.

The most commonly used of these existing encoding schemes are generally referred to as Reed-Solomon codes. Reed-Solomon codes rely on systems of algebraic equations. These codes are advantageous in that they require only the theoretical minimum amount of additional information to be transmitted with the actual data, while enabling a receiver to restore data in the face of significant transit data loss. However, Reed-Solomon codes require significant CPU power. In a system in which large numbers of data transfer units, such as packets, may be combined into sets (referred to herein as "bursts"), such CPU overhead may easily become prohibitively expensive.

Other existing error correction systems include what is generally referred to as the "Tornado codes" approach, which involves applying exclusive-OR (XOR) operations across randomly selected data subsets to generate error correction data. The Tornado codes approach is relatively fast in terms of computations, and may be used with relatively large sets of data. However, some Tornado codes based solutions are proprietary, and may not be available for use in all instances.

It would be desirable to have an FEC system which requires fewer computational resources than may be needed by Reed-Solomon systems, while also limiting the amount of redundant packets that are transmitted. The system should additionally not rely on any proprietary techniques, such as the Tornado codes approach.

SUMMARY OF THE INVENTION

In accordance with the present invention, a system and a method for forward error correction (FEC) are disclosed that are efficient in terms of computational requirements and the amount of redundant information that must be transmitted. Given an input set of data transfer units (DTUs) to be sent from a transmitting device to a receiving device, the disclosed system generates DTU subsets based on prime numbers. Each subset of input DTUs is used to generate a corresponding error correction DTU, by applying an XOR operation to the DTUs of the subset. The error correction DTUs are then appended to the input DTUs and transmitted to the receiver(s) in a burst. Thus the error correction DTUs generated by the disclosed system provide error correction information for the data DTUs transmitted within the burst. The receiving device then operates to identify any lost or damaged data DTUs in the received burst. For each such lost or damaged data DTU, the receiving device attempts to identify a DTU subset including that lost or damaged DTU, and which includes no other lost or damaged data DTU. The receiving device then operates to reconstruct the lost or damaged DTU using the other DTUs in the identified DTU subset, as well as the error correction DTU associated with that subset.

The disclosed system requires fewer computational resources than typically needed by Reed-Solomon systems, while providing an effective limit on the number of redundant (error correction) DTUs that are transmitted. While the disclosed system has CPU time requirements that are comparable with existing Tornado codes systems, it does not require or include Tornado codes techniques.

BRIEF DESCRIPTION OF THE SEVERAL VIEWS OF THE DRAWINGS

The invention will be more fully understood by reference to the following detailed description of the invention in conjunction with the drawings, of which.

DETAILED DESCRIPTION OF THE INVENTION

All disclosures of U.S. provisional patent application No. 60/335,996, filed Nov. 15, 2001, and entitled "Method and Apparatus for Encoding Error Correction Data," are hereby incorporated herein by reference.

Figure 1:
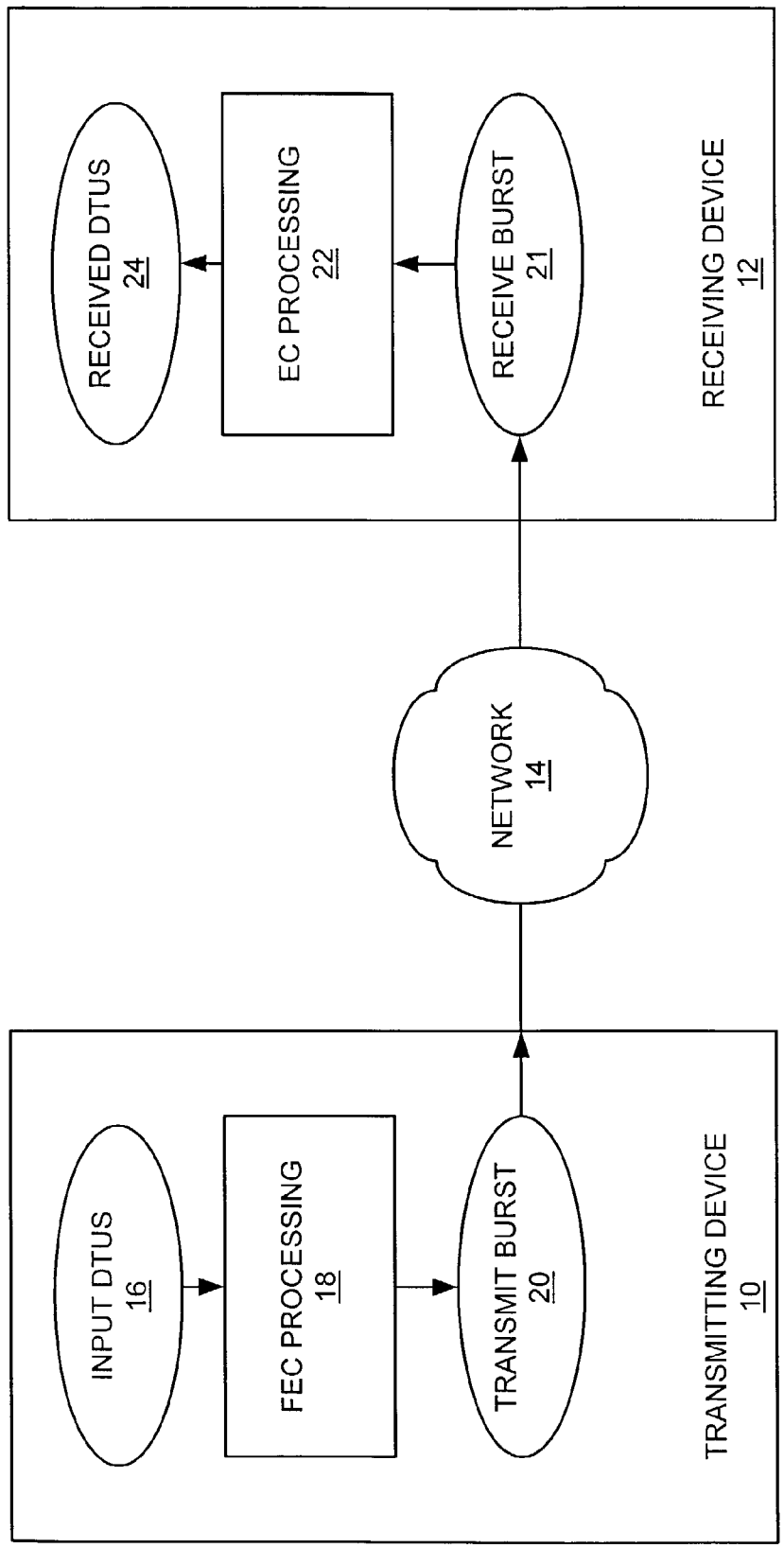
FIG. 1 is a block diagram showing a transmitting device and a receiving device communicating over a communication network.

FIG. 1 shows a transmitting device 10 and a receiving device 12 attached to a network 14. The transmitting device 10 and/or receiving device 12, for example, may each be any type of network attached device, such as server computer systems, personal computers, workstations, or other devices capable of communicating over a communication network. The transmitting device 10 and/or receiving device 12 may accordingly each include one or more processors, as well as computer program storage for storing computer program code that is executable on such processors. The transmitting device 10 and receiving device 12 may each further include various input/output interfaces, including network interfaces to the network 14. Further for purposes of explanation, the network 14 may be embodied using any appropriate communication media and networking protocols which enable the transfer of information between the transmitting device 10 and the receiving device 12.

During operation of the devices shown in FIG. 1, a number of data transfer units (DTUs) 16 are input to the FEC processing component 18 of the transmitting device. The disclosed system may be used with any specific kind of DTU, including frames, packets, datagrams, cells, or other types of data blocks for transfer across the network 14. The FEC processing component 18 may, for example, be embodied using any appropriate combination of software code and/or programmable or custom hardware based technology. The FEC processing component 18 operates to generate a number of error correction (EC) DTUs that are combined with the input data DTUs 16 to form the transmit burst 20. The transmit burst 20 is then transmitted from the transmitting device 10, over the network 14, to the receiving device 12.

The receiving device 12 then receives the receive burst 21 and passes it to the EC processing component 22. The EC processing component 22 may also, for example, be embodied using any appropriate combination of software code and/or programmable or custom hardware based technology. The EC processing component 22 operates to identify any data DTUs within the receive burst 21 that have been lost or damaged, and to restore any such lost or damaged DTUs that can be restored to form a complete set of received DTUs 24.

While for purposes of concise illustration a single receiving device 12 is shown in FIG. 1, the disclosed system is advantageously applicable where a single transmitting device 10 operates to transmit individual bursts that are each received by multiple receiving devices. For example, such may be the case where multicast destination addresses are employed. In the case where multiple receiving devices are employed, the structure and operation described herein with reference to receiving device 12 is applicable to any or all of such multiple receiving devices.

Figure 2:
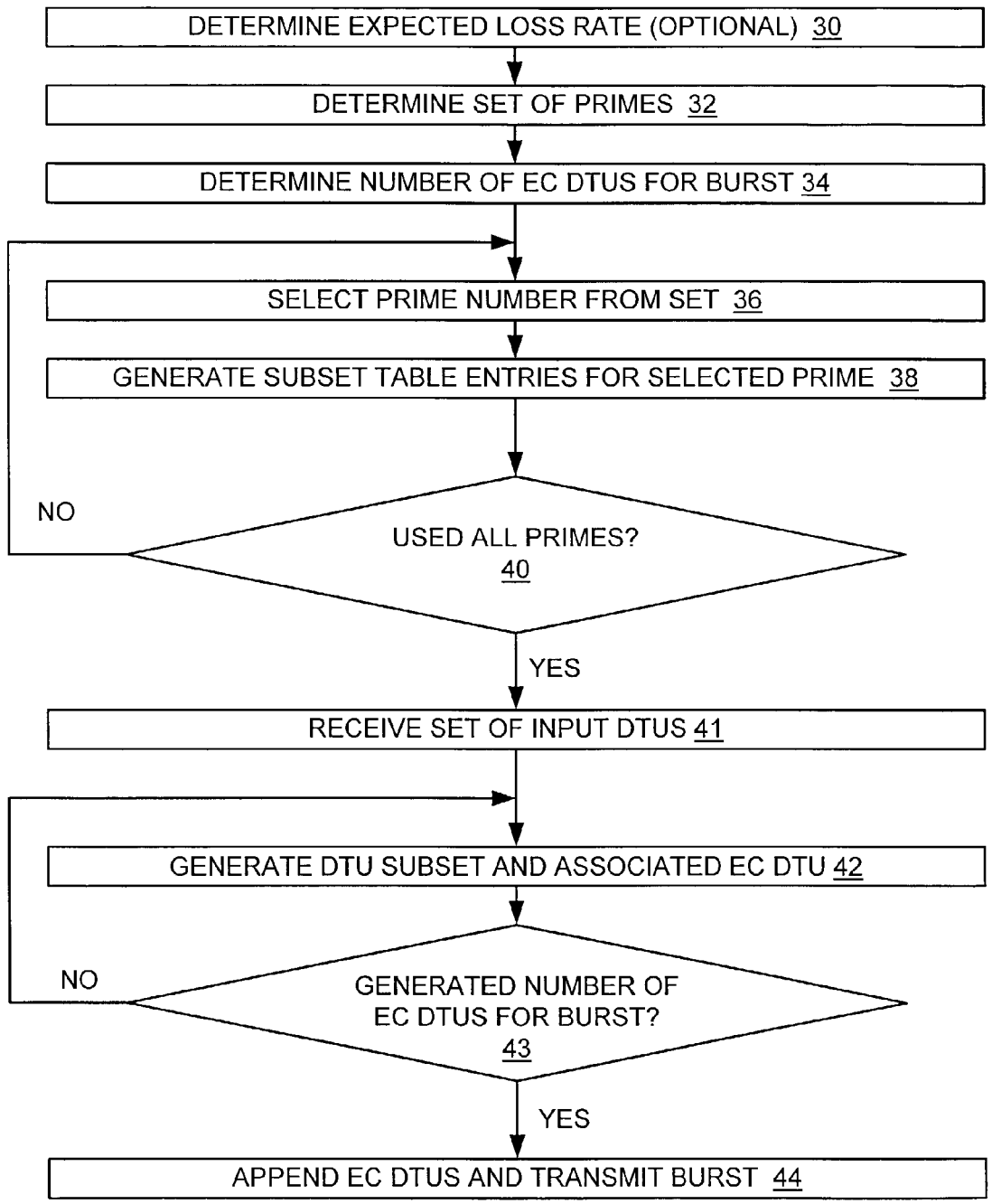
FIG. 2 is a flow chart showing steps performed by an illustrative embodiment of a transmitting device.

Now with reference to FIG. 2, the steps performed in an illustrative embodiment of a transmitting device are described. At step 30, the disclosed system may operate to determine an expected loss rate for the network 14 of FIG. 1. Such a loss rate of the relevant network may, for example, be a configurable parameter provided by a network administrator, or be determined through an automatic network test. The loss rate determined at step 30 may then be used to determine or configure other parameters of the system. Alternatively, the disclosed system may not determine an expected loss rate, in which case any such system parameters would be preset or determined based on other parameters or conditions. Moreover, after the transmitting device begins transmission of data, the disclosed system may determine and/or calculate actual loss rates, which may be used to control system parameters relating to forward error correction, such as the number of error correction DTUs that are included in each burst.

At step 32 the disclosed system determines a set of prime numbers that are to be used to generate a subset table. The subset table may, for example, be generated prior to transmission of data by the transmitting system. The number and values of the prime numbers in the set of prime numbers used to generate the subset table may, for example, be determined in response to configurable parameters that are directly specified by a user. The primes in the set of prime numbers may or may not be sequential, and certain predetermined prime numbers may be omitted in order to optimize performance. Thus a set of prime numbers in which one or more prime numbers are skipped may be employed. Such a set of prime numbers might, for example, include the following series of prime numbers: 3, 7, and 13. In this example, the primes 5 and 11 were omitted. The specific primes that are omitted may be determined based on experienced system performance and/or testing.

At step 34, the disclosed system determines the number of error correction DTUs that are to be transmitted within each burst. The number of error correction DTUs determined at step 34 may, for example, be directly user specified as a configurable parameter. Alternatively, the number of error correction DTUs determined at step 34 may be responsive to any expected loss rate determined at step 30, or may be dynamically configurable in response to an actual loss rate that is determined or calculated during system operation. As the number of error correction DTUs transmitted with each burst increases, the likelihood that a receiver can recover from a loss of data within a burst is increased. Accordingly, in response to larger or increasing experienced loss rates, the disclosed system may operate to generate and include larger numbers of error correction DTUs for the bursts it transmits, in order to provide acceptable levels of loss recovery. In one embodiment, a limit is placed on the number of error correction DTUs that may be included in a burst. For example, the number of error correction DTUs included in a burst may be limited such that it must be less than the number of data DTUs in the burst.

Steps 36 through 40 are then repeated for all primes in the set of primes determined at step 32, in order to generate the subset table. In the illustrative embodiment, the primes within the set of primes are each smaller than a number of data DTUs N included in a burst. For example, in an illustrative embodiment, the number of DTUs in the set of input data DTUs 16 is N, and is also referred to as the "burst size." The value of N may be configurable, and is predefined for purposes of explanation in the illustrative embodiment. A suitable value for N in a given implementation may be determined in a variety of different ways. For example, an embodiment of the disclosed system operates well where the burst size is set to a value on the order of 100 or 1000, thus reflecting a burst size in the 100s or 1000s of data DTUs.

At step 36, a prime number p1 is selected from the set of prime numbers determined at step 32. The prime number p1 is then used to generate entries in a subset table. Each entry in the subset table indicates the positions of DTUs within a burst that are to be used to form one error correction DTU. For purposes of explanation in connection with FIG. 2, the data DTUs within a burst are considered numbered from 1 to N. Thus the values stored in each subset table entry are values within the range from 1 to N. At step 38, p1 is used to generate the following subset table entries:

subset table entry 1={1, p1+1, 2*p1+1, 3*p1+1 . . . (the biggest n*p1+1 less than or equal to N)}, subset table entry 2={2, p1+2, 2*p1+2, 3*p1+1 . . . (the biggest n*p1+2 less than or equal to N)},

.
.
.

subset table entry p1={p1, 2*p1, 3*p1 . . . (the biggest n*p1 less than or equal to N)} where each value of the list elements within the "{ }" brackets indicates a position of a DTU that is to be included in the corresponding DTU subset generated based on that subset table entry. The number of subset table entries generated by each iteration through step 38 is equal to the size of the prime number being used. Accordingly, for the selected prime p1 above p1 subset table entries are generated. The total number of entries in a subset table generated for a given set of prime numbers is p1+p2+p3+ . . . +pk, where k is the number of primes in the set.

At step 40, the disclosed system determines whether all primes in the set of prime numbers have been used. If not, then steps 36 through 40 are repeated using another selected prime number from the set. Otherwise, the system is ready to transmit, and at step 41 the disclosed system may receive a set of input DTUs, such as the input DTUs 16 of FIG. 1.

Following receipt of the input DTUs, the disclosed system iteratively performs step 42 in order to generate DTU subsets and error correction DTUs from the input DTUs based on the previously formed subset table. Each iteration through step 42 generates one DTU subset consisting of DTUs within the input DTUs that are indicated by a corresponding entry in the subset table. Accordingly, on a first pass through step 42, the disclosed system operates to identify a DTU subset consisting of those DTUs indicated by the DTU positions indicated first entry of the subset table. After a DTU subset is identified, the DTUs within the subset are used to form an associated error correction DTU, for example by an exclusive-OR operation across all the DTUs within the subset. Accordingly, each iteration through step 42 results in the generation of one error correction DTU, based on one entry in the subset table. At step 43 the disclosed system determines whether the total number of error correction DTUs that have been generated is equal to the number of error correction DTUs to be included in a burst, for example as determined at step 34. If not, then step 42 is repeated using the next entry from the subset table. Otherwise, step 43 is followed by step 44, in which the error correction DTUs are appended to the input data DTUs, and the resulting burst is transmitted to the receiving device or devices. The error correction DTUs may be appended to the burst at any appropriate position within the burst, such that the receiving device understands the location of each error correction DTU, and so that the receiving device can associate each error correction DTU with its data DTU subset.

Figure 3:
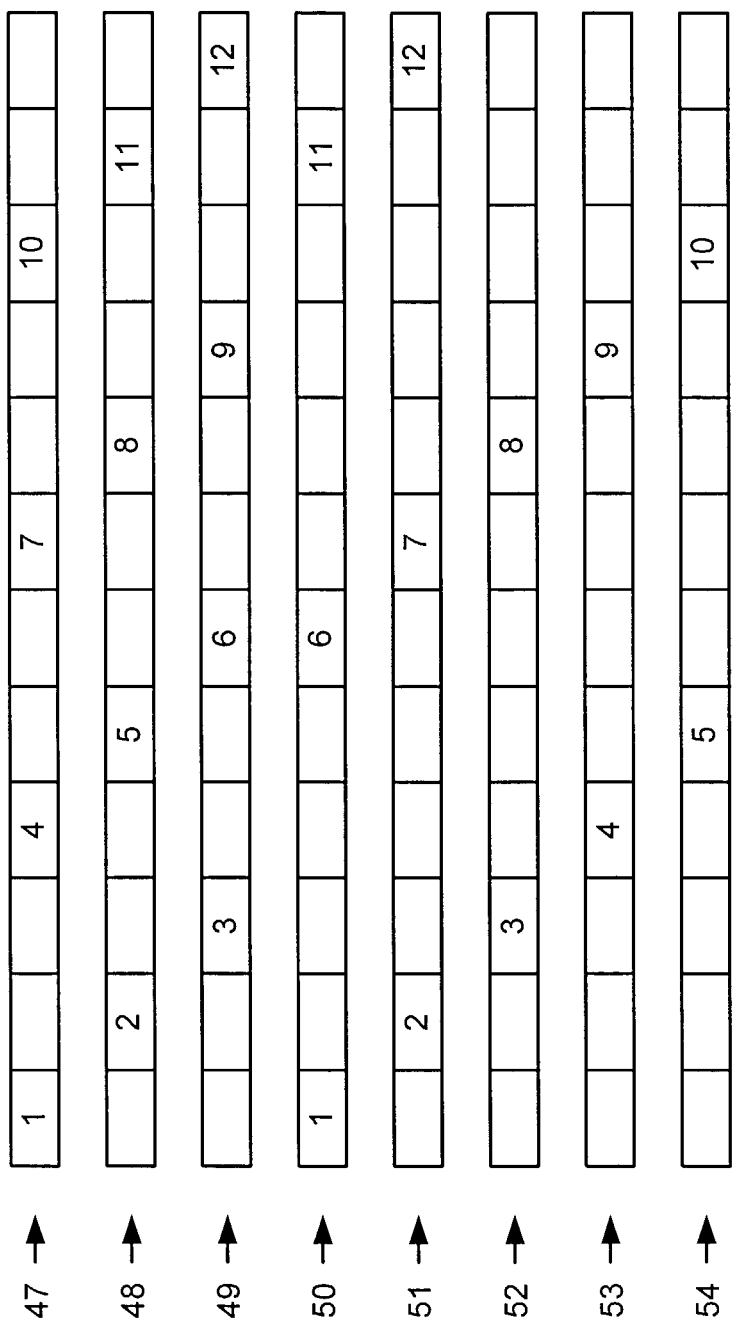
FIG. 3 is a block diagram illustrating entries in a subset table generated by an embodiment of the disclosed system.

FIG. 3 illustrates a number of entries in a subset table. The subset table entries shown in FIG. 3 correspond to the prime numbers 3 and 5. For purposes of illustration, the DTU positions indicated by each subset table entry range between 1 and 12. While the table shown in FIG. 3 indicates DTU positions ranging between 1 and 12, the disclosed system may be embodied for various burst sizes. In particular, the subset table may be generated such that it may be applied to bursts of sizes ranging up to the thousands of DTUs. For example, subset table entries identifying DTU positions up to a potential maximum burst size of 2000 DTUs have been employed in one embodiment. Moreover, while the subset table entries in FIG. 3 are shown only for the prime numbers 3 and 5, resulting in a total of 8 table entries, the specific number of subset table entries for a given embodiment is implementation dependent. For example, in one embodiment, the number of error correction DTUs may be configured up to a value equal to the maximum number of data DTUs within a burst. Accordingly, in such an embodiment, for a configuration in which the maximum burst size is set to 2000 DTUs, the subset table would be formed to include 2000 entries.

Again with reference to FIG. 3, the subset table entries 47, 48 and 49 are generated by the disclosed system at step 38 of FIG. 2 in response to the prime number 3. Subset table entries 50, 51, 52, 53, 54 and 55 are generated by the disclosed system at step 38 of FIG. 2 in response to the prime number 5.

While the table shown in FIG. 3 is shown in a specific format for purposes of illustration, other data structures may alternatively be employed as the subset table. In particular, the representation shown in FIG. 3 illustrates a sparsely populated matrix representation, which may be reduced in size using various conventional techniques. For example, the positions of DTUs for each table entry may be stored as lists of integers.

Figure 4:
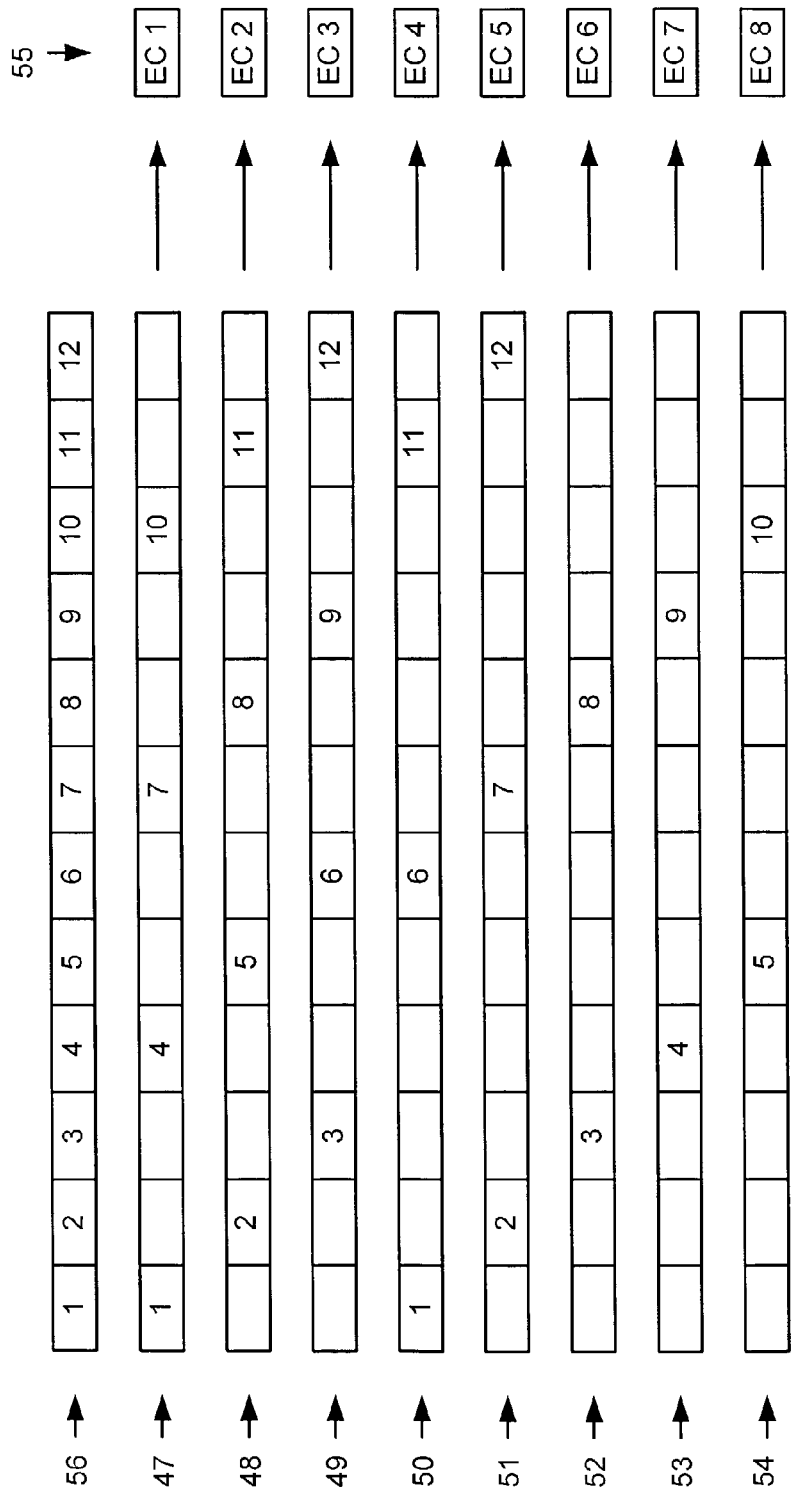
FIG. 4 is a block diagram illustrating generation of error correction DTUs for a set of input DTUs based on the subset table.

FIG. 4 illustrates the generation of error correction DTUs based on the application of subset table entries to a set of input DTUs. For purposes of illustration, the input DTUs 56 are shown numbered from 1 to 12. As shown in FIG. 4, each of the error correction DTUs 55 corresponds to a subset table entry that is used to generate it. Accordingly, error correction DTU EC 1 is generated based on subset table entry 47, error correction DTU EC 2 is generated based on subset table entry 48, error correction DTU EC 3 is generated based on subset table entry 49, and so forth. For example, each of the error correction DTUs 55 may be generated by an XOR operation across all of the data DTUs indicated by the corresponding subset table entry.

As shown in FIG. 4, the subset table entry 47 indicates input DTUs 1, 4, 7 and 10. The subset table entry 47 was determined at step 38 of FIG. 2 in response to the prime number 3 ("p1") as follows:

{1, p1+1, 2*p1+1, 3*p1+1}

The error correction DTU EC 1 is therefore an XOR of the input DTUs 1, 4, 7 and 10.

The subset table entry 48 indicates input DTUs 2, 5, 8 and 11. The subset table entry 48 was determined at step 38 of FIG. 2 in response to the prime number 3 ("p1") as follows:

{2, p1+2, 2*p1+2, 3*p1+2}

The error correction DTU EC 2 is therefore an XOR of the input DTUs 2, 5, 8 and 11.

The subset table entry 49 indicates input DTUs 3, 6, 9 and 12. The subset table entry 48 was determined at step 38 of FIG. 2 in response to the prime number 3 ("p1") as follows:

{p1, 2*p1, 3*p1, 4*p1}

The error correction DTU EC 3 is therefore an XOR of the input DTUs 3, 6, 9 and 12.

With regard to the prime number 5, and as further shown in FIG. 4, the subset table entry 50 indicates input DTUs 1, 6 and 11, and was determined in step 38 of FIG. 2 in response to the prime number 5 ("p2") as follows:

{1, p2+1, 2*p2+1}

Accordingly, the error correction DTU EC 4 is therefore an XOR or of the input DTUs 1, 6 and 11.

The subset table entry 51 indicates DTUs 2, 7 and 12, and was determined in step 38 of FIG. 2 in response to the prime number 5 ("p5") as follows:

{2, p2+2, 2*p2+2, 3*p2+2}

The error correction DTU EC 5 is therefore an XOR of the input DTUs 2, 7 and 12.

The subset table entry 52 indicates input DTUs 3 and 8, and was determined in step 38 of FIG. 2 in response to the prime number 5 ("p2") as follows:

{3, p2+3}

The error correction DTU EC 6 is accordingly an XOR of the input DTUs 3 and 8.

The subset table entry 53 indicates DTUs 4 and 9, and was determined in step 38 of FIG. 2 in response to the prime number 5 ("p5") as follows:

{4, p2+4}

The error correction DTU EC 7 therefore is accordingly an XOR of the input DTUs 4 and 9.

And the subset table entry 54 indicates input DTUs 5 and 10, and was generated in step 38 of FIG. 2 in response to the prime number 5 ("p2") as follows:

{p2, 2*p2}

In a receiving device, such as the receiving device 12 of FIG. 1, in order to restore a lost data DTU within a received burst, the disclosed system operates to find a data DTU subset meeting the following conditions:
  the lost data DTU is a member of the subset; and
  all other data DTUs in the subset, except for the lost data DTU, were received correctly.

Figure 5:
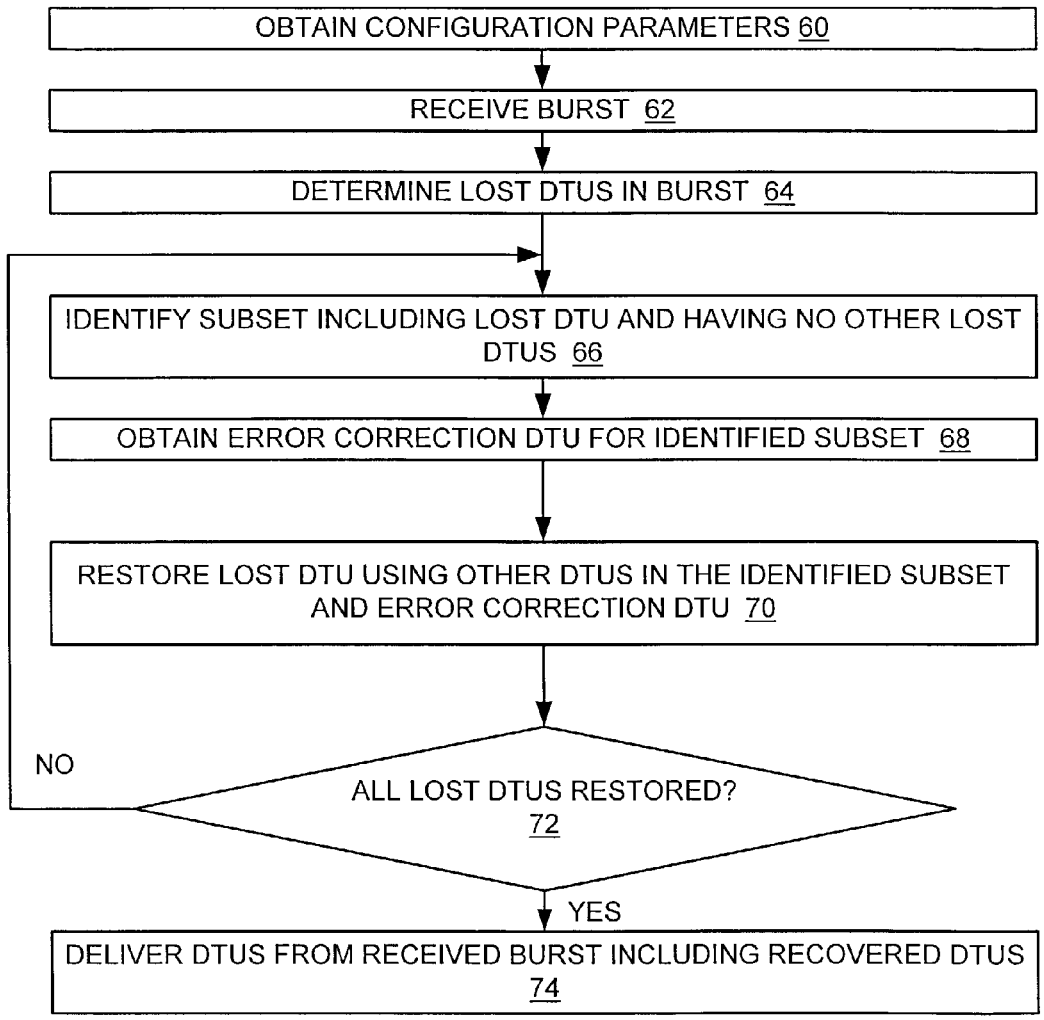
FIG. 5 is a flow chart showing steps performed by an illustrative embodiment in a receiving device.

The steps performed in a receiving device are more fully illustrated in FIG. 5. As shown in FIG. 5, at step 60, a receiving device is provided with a number of configuration parameters. The configuration parameters provided at step 60 include a description of the set of the subset table used to generate the error correction DTUs, as well as the number of error correction DTUs included in each burst.

At step 62, the receiving device receives a burst including data DTUs and error correction DTUs. At step 64, the receiving device identifies any lost or damaged data DTUs in the received burst. In one embodiment, when each data DTU within the burst is received at the receiving device, the receiving device reads an ID number contained in that data DTU. The ID number indicates the position of the data DTU within the current burst. Missing or damages data DTUs can then be identified as the data DTUs in the burst are received. Accordingly, in an embodiment in which the error correction DTUs are appended to the burst following the set of data DTUs, by the time the receiving device begins receiving the appended error correction DTUs, the receiving device has determined which data DTUs are missing or damaged within the burst. Damaged or lost DTUs within a burst may also be identified using various specific conventional techniques, such as cyclic redundancy checking (CRC).

In steps 66, 68, 70 and 72, the receiving device operates to restore a lost or damaged data DTU. Accordingly, the steps 66, 68, 70 and 72 are repeated for each lost or damaged data DTU in the burst received at step 62. At step 66, the receiving device identifies a data DTU subset within the received burst that includes the lost or damaged DTU, and for which all other data DTUs were either correctly received or previously restored. A given lost DTU may be present in more than one subset. For example, DTU 6 in FIG. 4 is included in both the DTU subset for subset table entry 49 and the DTU subset for subset table entry 50. Accordingly, if both DTU 6 and DTU 3 were lost in a given burst, then the DTU subset for subset table entry 50 could first be used to restore DTU 6. Then the DTU subset indicated by subset table entry 49, including the previously restored DTU 6, could be used to restore DTU 3.

At step 68, the receiving device obtains the error correction DTU corresponding to the subset identified in step 66. For example, the error correction DTU corresponding to the subset identified in step 66 may be located within a number of error correction DTUs appended to the end of the received burst.

At step 70, the receiving device performs an XOR operation with respect to all the data DTUs other than the lost DTU in the identified, subset together with the value of the associated error correction DTU. The result is a restored copy of the lost or damaged DTU. As noted above, the restored DTU may then be used for the restoration of other lost DTUs as needed. At step 72, the receiving device determines whether all lost or damaged data DTUs in the received burst have been restored. If not, steps 66, 68 and 70 are repeated for the next lost or damaged data DTU in the burst. After all the lost or damaged DTUs are restored, then at step 74 the received burst is delivered to any appropriate processing functionality in the receiving device.

In a preferred embodiment, the disclosed system operates in an environment in which file and/or streaming media content delivery is provided from a transmitting device to multiple receiving devices. For example, data may be delivered using the disclosed system over a multicast enabled network, such as a multicast enabled communication satellite-based communication network. Also in a preferred embodiment, status reports indicating whether the transmitted data was received correctly may be sent over a separate back-channel communication system, for example as provided over the Internet.

Figure 6:
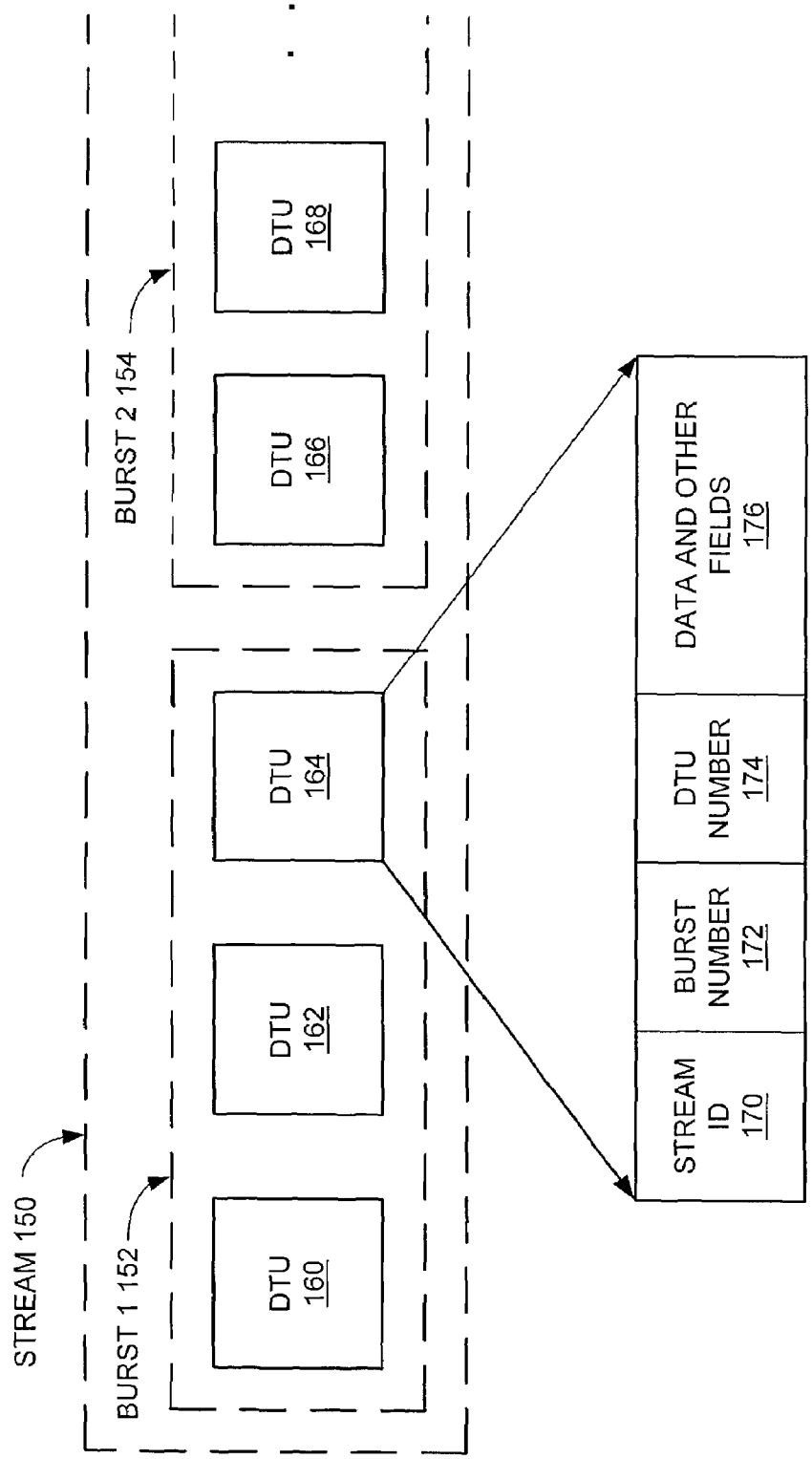
FIG. 6 is a block diagram showing an example of bursts of DTUs in a communication stream.

FIG. 6 shows an example of a data stream 150 including a series of multiple bursts, shown as burst 1 152 and burst 2 154. The stream 150 represents the communication of a contiguous stream of data from a transmitting device to multiple receiving devices, for example using multicast addressing, as in the case of a streaming media server application. A data stream such as the data stream 150 may include any number of bursts. Each of the bursts within the data stream 150 includes a series of multiple DTUs, shown as DTU 160, DTU 162 and DTU 164 in burst 1 152, and as DTU 166 and DTU 168 in burst 2 154. An example of fields for a DTU is shown with regard to DTU 164. The illustrative DTU fields are shown as including a stream ID 170, which identifies the data stream that includes the DTU, a burst number 172 that identifies the position of the burst containing the DTU within the stream, and a DTU number 174 that identifies the position of the DTU within the burst that contains it. The DTU 164 is further shown to include data and other fields 176.

As shown in FIG. 6, a burst may not include header information other than that associated with each DTU. Specifically, the association of DTUs into a burst is accomplished through the information contained in the burst number field 172 of each DTU contained in the burst. Further, the structure of each burst, in terms of the positions of the DTUs it contains, is described in the DTU number field 174. Accordingly, the burst "header" may be thought of as being distributed across the DTUs included within the burst.

Figure 7:
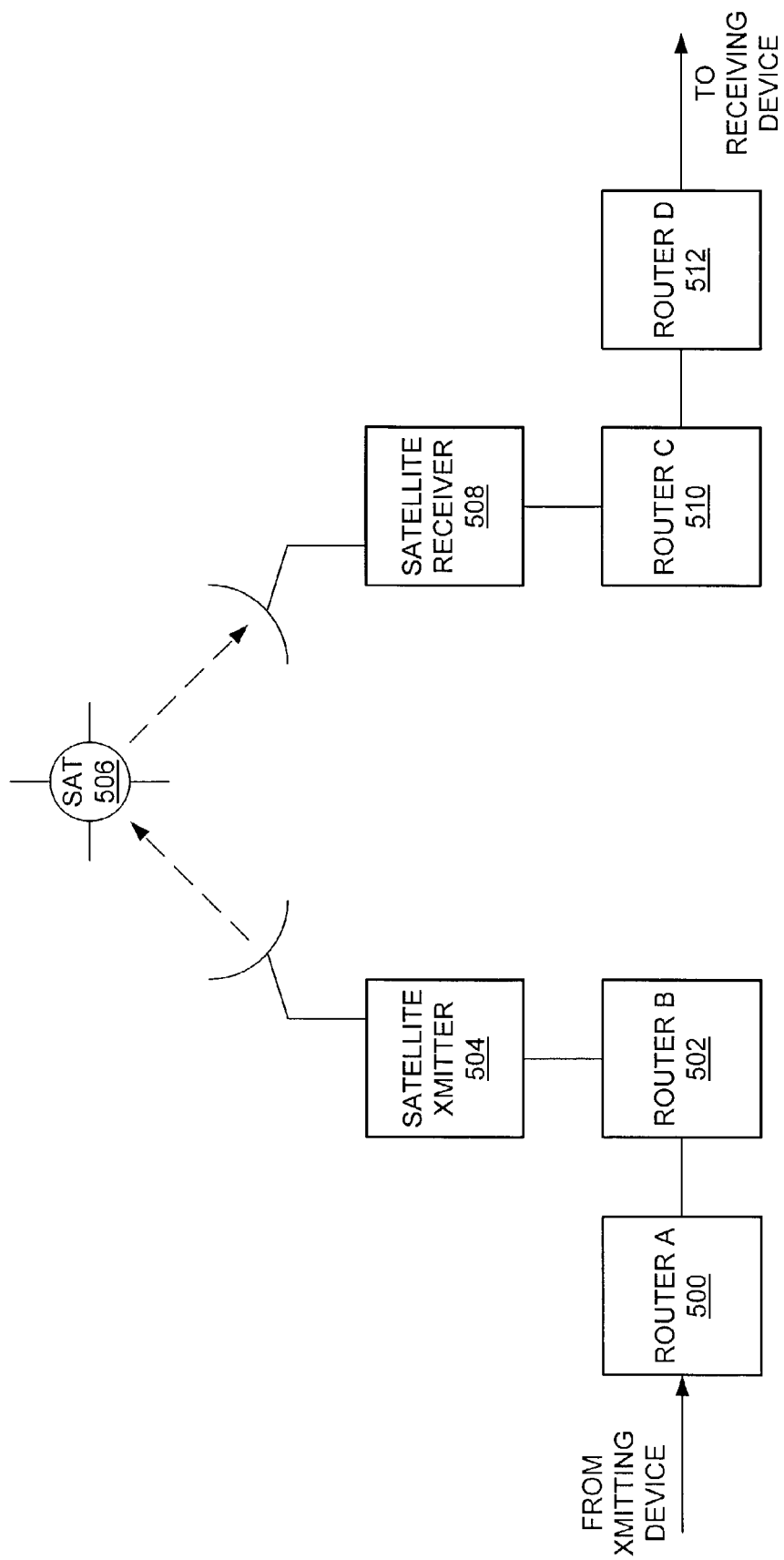
FIG. 7 shows an example configuration of the network 14 in FIG. 1.

FIG. 7 is a block diagram showing an example of a network over which data may be communicated using an embodiment of the disclosed system. The network illustrated in FIG. 7 is an example of the network 14 shown in FIG. 1. As shown in FIG. 7, data from a transmitting device passes through a Router A 500, to a Router B 502, and then to a Satellite Transmitter 504, which forwards the data to a Communications Satellite 506. The data is then passed by the Communications Satellite 506 to a Satellite Receiver 508, from which the data is passed through Router C 510 and Router D 512 to one or more receiving devices. The routers shown in FIG. 7 operate over an underlying communications network for which an MTU (Maximum Transmission Unit, Maximum Transfer Unit) may be predefined. The MTU for such a communications network is the largest frame size that can be transmitted over the network. Messages longer than the MTU must be divided into smaller frames. Typically, the layer 3 protocol (IP, IPX, etc.) extracts the MTU from the layer 2 protocol (Ethernet, FDDI, etc.), fragments the messages into that frame size and makes them available to the lower layer for transmission.

Figure 8:
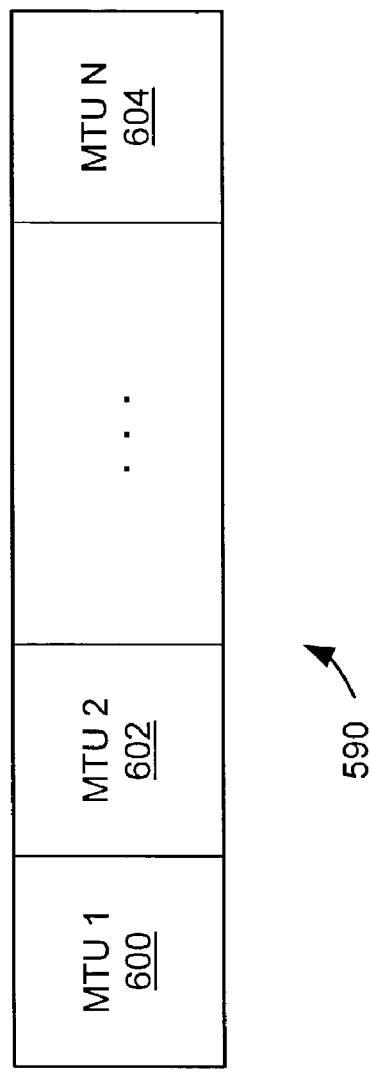
FIG. 8 shows an example of the data and other fields portion 176 of a DTU as shown in FIG. 6.

FIG. 8 shows how the contents of an individual DTU may be configured to reflect the MTUs used in an underlying network such as the communications network shown in FIG. 7. As shown in FIG. 6, the format of a DTU may include a data and other fields portion 176. FIG. 8 shows an example of the format of the data and other fields portion of the DTU. The format shown in FIG. 8 includes one or more MTUs, including an MTU 1 600, MTU 2 602, through MTU N 604. In this way, the size of the DTU may be advantageously determined to reflect the size of MTU within the underlying network. As a result, bandwidth utilization is improved. In specific embodiments or operational environments, the contents of each DTU may therefore consist of one or more Ethernet packets, or one or more IP packets.

The DTU size for a given embodiment may further be configured as a function of the loss rate of the underlying network. In this approach, smaller DTU sizes would be used when the underlying network provides more unreliable performance. Accordingly, for higher loss rates, smaller DTUs would be used, thus making relatively frequent retransmission of data more efficient, since less successfully received data would necessarily be included in each retransmission.

Those skilled in the art should readily appreciate that programs defining the functions of the disclosed system and method can be implemented in software and delivered to a system for execution in many forms; including, but not limited to: (a) information permanently stored on non-writable storage media (e.g. read only memory devices within a computer such as ROM or CD-ROM disks readable by a computer I/O attachment); (b) information alterably stored on writable storage media (e.g. floppy disks and hard drives); or (c) information conveyed to a computer through communication media for example using baseband signaling or broadband signaling techniques, including carrier wave signaling techniques, such as over computer or telephone networks via a modem. In addition, while the illustrative embodiments may be implemented in computer software, the functions within the illustrative embodiments may alternatively be embodied in part or in whole using hardware components such as Application Specific Integrated Circuits, Field Programmable Gate Arrays, or other hardware, or in some combination of hardware components and software components.

What is claimed is:

1. A method for generating error correction information, comprising:
   selecting at least one prime number from a set of prime numbers;
   obtaining a set of data transfer units;
   determining, responsive to said prime number and said set of data transfer units, a plurality of subsets of said data transfer units;
   generating, based on said plurality of subsets of said data transfer units, a plurality of error correction data transfer units;
   associating said plurality of error correction data transfer units with said set of data transfer units; and
   transmitting said plurality of error correction data transfer units and said set of data transfer units to at least one receiving device.

2. The method of claim 1, wherein said obtaining said set of data transfer units comprises obtaining a set of data packets.

3. The method of claim 1, further comprising:
   determining a number of error correction data transfer units to be included with said set of data transfer units, wherein said plurality of error correction data transfer units includes said number of error correction data transfer units.

4. The method of claim 3, wherein said determining said number of error correction data transfer units to be included with said set of data transfer units is responsive to a loss rate, wherein a relatively large number of error correction data transfer units is included with said set of data transfer units in response to a relatively large loss rate.

5. The method of claim 1, further comprising:
   determining a maximum number of data transfer units permitted in said set of data transfer units; and
   selecting prime numbers for said set of prime numbers such that each prime number in said set of prime numbers is not greater than said maximum number of data transfer units permitted in said set of data transfer units.

6. The method of claim 1, wherein said determining said plurality of subsets of said data transfer units further comprises, for each of said plurality of subsets of said data transfer units:
   identifying positions within said set of data transfer units of data transfer units that are within said subset, and wherein said positions are each separated by a number of positions equal to the size of said prime number minus one.

7. The method of claim 6, wherein said determining said plurality of subsets of said data transfer units further comprises generating a number of subsets equal to a size of said prime number.

8. The method of claim 1, wherein said selecting said at least one prime number from said set of prime numbers comprises selecting each prime number from said set of prime numbers.

9. The method of claim 1, wherein said generating said plurality of error correction data transfer units comprises, for each generated error correction data transfer unit, applying an exclusive "OR" operation to data transfer units in a corresponding one of said plurality of subsets of said data transfer units.

10. The method of claim 1, wherein said associating said plurality of error correction data transfer units with said set of data transfer units comprises appending said plurality of error correction data transfer units to said set of data transfer units.

11. A network device for generating error correction information, wherein said network device is operable to:
select at least one prime number from a set of prime numbers;
obtain a set of data transfer units;
determine, responsive to said prime number and said set of data transfer units, a plurality of subsets of said data transfer units;
generate, based on said plurality of subsets of said data transfer units, a plurality of error correction data transfer units;
associate said plurality of error correction data transfer units with said set of data transfer units; and
transmit said plurality of error correction data transfer units and said set of data transfer units to at least one receiving device.

12. The network device of claim 11, wherein said network device further comprises at least one processor coupled to a program memory.

13. A computer program product, including a computer readable medium, said computer readable medium having a computer program stored thereon, said computer program for generating error correction information, said computer program comprising:
program code for selecting at least one prime number from a set of prime numbers;
program code for obtaining a set of data transfer units;
program code for determining, responsive to said prime number and said set of data transfer units, a plurality of subsets of said data transfer units;
program code for generating, based on said plurality of subsets of said data transfer units, a plurality of error correction data transfer units;
program code for associating said plurality of error correction data transfer units with said set of data transfer units; and
program code for transmitting said plurality of error correction data transfer units and said set of data transfer units to at least one receiving device.

14. A system for generating error correction information, comprising:
means for selecting at least one prime number from a set of prime numbers;
means for obtaining a set of data transfer units;
means for determining, responsive to said prime number and said set of data transfer units, a plurality of subsets of said data transfer units;
means for generating, based on said plurality of subsets of said data transfer units, a plurality of error correction data transfer units;
means for associating said plurality of error correction data transfer units with said set of data transfer units; and
means for transmitting said plurality of error correction data transfer units and said set of data transfer units to at least one receiving device.

15. A method for performing error correction, comprising:
receiving a set of data transfer units and a plurality of error correction data transfer units;
determining an incorrectly received one of said received data transfer units;
identifying a subset of said received data transfer units including said incorrectly received data transfer unit, wherein a position of each data transfer unit within said subset is separated by a number of data transfer units equal to a prime number minus one;
determining an error correction data transfer unit associated with said subset of said received data transfer units; and
restoring said incorrectly received data transfer unit responsive to said subset of said received data transfer units and said error correction data transfer unit associated with said subset of said received data transfer units.

16. The method of claim 15, wherein said restoring said incorrectly received data transfer unit further comprises performing a logical "OR" operation on said error correction data transfer unit and data transfer units in said subset other than said incorrectly received data transfer unit.

17. The method of claim 15, wherein said determining said incorrectly received one of said received data transfer units comprises determining that said incorrectly received one of said data transfer units was lost.

18. The method of claim 15 wherein said identifying said subset of said received data transfer units including said incorrectly received data transfer unit further comprises identifying a subset of said received data transfer units wherein all data transfer units other than said incorrectly received data transfer unit in said subset were correctly received.

19. A network device for performing error correction, said network device operable to:
receive a set of data transfer units and a plurality of error correction data transfer units;
determine an incorrectly received one of said received data transfer units;
identify a subset of said received data transfer units including said incorrectly received data transfer unit, wherein a position of each data transfer unit within said subset is separated by a number of data transfer units equal to a prime number minus one;
determine an error correction data transfer unit associated with said subset of said received data transfer units; and
restore said incorrectly received data transfer unit responsive to said subset of said received data transfer units and said error correction data transfer unit associated with said subset of said received data transfer units.

20. The network device of claim 19, wherein said network device further comprises at least one processor coupled to a program memory.

21. A computer program product, including a computer readable medium, said computer readable medium having a computer program stored thereon, said computer program for performing error correction, said computer program comprising:
program code for receiving a set of data transfer units and a plurality of error correction data transfer units;
program code for determining an incorrectly received one of said received data transfer units;
program code for identifying a subset of said received data transfer units including said incorrectly received data transfer unit, wherein a position of each data transfer unit within said subset is separated by a number of data transfer units equal to a prime number minus one;
program code for determining an error correction data transfer unit associated with said subset of said received data transfer units; and program code for restoring said incorrectly received data transfer unit responsive to said subset of said received data transfer units and said error correction data transfer unit associated with said subset of said received data transfer units.

22. A system for performing error correction, comprising:

means for receiving a set of data transfer units and a plurality of error correction data transfer units;

means for determining an incorrectly received one of said received data transfer units;

means for identifying a subset of said received data transfer units including said incorrectly received data transfer unit, wherein a position of each data transfer unit within said subset is separated by a number of data transfer units equal to a prime number minus one;

means for determining an error correction data transfer unit associated with said subset of said received data transfer units; and means for restoring said incorrectly received data transfer unit responsive to said subset of said received data transfer units and said error correction data transfer unit associated with said subset of said received data transfer units.

* * * * *